(12) United States Patent
Ishida

(10) Patent No.: US 7,352,190 B1
(45) Date of Patent: Apr. 1, 2008

(54) CALIBRATION APPARATUS, CALIBRATION METHOD, AND TESTING APPARATUS

(75) Inventor: Masahiro Ishida, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/582,142

(22) Filed: Oct. 17, 2006

(51) Int. Cl.
*G01R 35/00* (2006.01)
*G01R 29/26* (2006.01)
*H04B 17/00* (2006.01)

(52) U.S. Cl. ............... 324/601; 375/226; 702/69
(58) Field of Classification Search ........... 324/601, 324/202, 130, 74, 76.53, 158.1; 375/224, 375/376; 73/1.01; 702/85
See application file for complete search history.

(56) References Cited

U.S. PATENT DOCUMENTS

| | | | | |
|---|---|---|---|---|
| 5,515,404 | A * | 5/1996 | Pearce | 375/371 |
| 6,671,652 | B2 * | 12/2003 | Watson, Jr. et al. | 702/177 |
| 6,788,045 | B2 * | 9/2004 | Gauthier et al. | 324/76.53 |
| 7,023,195 | B2 * | 4/2006 | Rosenbaum et al. | 324/76.53 |
| 2005/0163204 | A1 * | 7/2005 | Brewer | 375/224 |
| 2005/0278131 | A1 * | 12/2005 | Rifani et al. | 702/79 |
| 2006/0182170 | A1 * | 8/2006 | Ichiyama et al. | 375/226 |
| 2006/0269031 | A1 * | 11/2006 | Eckhardt et al. | 375/371 |
| 2007/0236284 | A1 * | 10/2007 | Ichiyama et al. | 329/311 |

* cited by examiner

*Primary Examiner*—Vincent Q. Nguyen
*Assistant Examiner*—Hoai-An D. Nguyen
(74) *Attorney, Agent, or Firm*—Osha·Liang LLP

(57) ABSTRACT

A jitter measuring circuit includes a jitter signal generating section that generates a jitter signal, and an integrating section that charges and discharges a capacitor with a predetermined electric current according to the jitter signal to integrate the jitter signal and outputs a jitter measuring signal with a level according to an amount of jitter in the input signal. A calibration apparatus includes a current control section that makes the integrating section output at least one of a predetermined charging current and a predetermined discharging current for charging and discharging the capacitor, a voltage measuring section that measures voltage variation of the capacitor in a state where the charging current or the discharging current is output by the current control section, and a gain computing section that computes gain of the integrating section based on the voltage variation measured by the voltage measuring section.

8 Claims, 10 Drawing Sheets

CALIBRATION APPARATUS, CALIBRATION METHOD, AND TESTING APPARATUS

BACKGROUND

1. Field of the Invention

The present invention relates to a calibration apparatus, a calibration method, and a testing apparatus. More particularly, the present invention relates to a calibration apparatus that calibrates a jitter measuring circuit for measuring a jitter in an input signal.

2. Related Art

There is considered a circuit for measuring a jitter in an on-chip mode as a circuit for measuring a jitter. For example, this circuit measures a jitter in a high frequency signal generated from the inside of chip, and converts jitter amplitude of the measured signal into voltage magnitude, in order to output the voltage magnitude to the outside of chip. It is possible to detect a jitter value outside the chip by dividing the voltage magnitude by jitter output gain of the jitter measuring circuit.

Jitter output gain of the jitter measuring circuit can use a designed value based on a circuit design. Moreover, as another method, there is also considered a method for supplying a signal having a known jitter from the outside of chip to the jitter measuring circuit and measuring output magnitude of the jitter measuring circuit.

However, as a process of manufacturing a semiconductor miniaturizes, characteristics of circuit elements such as a transistor, a resistor, capacitance, or the like in the jitter measuring circuit largely fluctuate according to the variation of process. For this reason, real jitter output gain has a large error for the designed value.

Moreover, in case of a method of inputting a signal having a known jitter from the outside of chip, it is necessary to input a signal having frequency equal to a high frequency signal on chip from the outside so that a characteristic of the jitter measuring circuit is equal to that when measuring a high frequency signal on chip. However, it is difficult to supply, e.g., a high frequency signal around several GHz from input pins of the chip into the chip.

Moreover, in this case, since the quality of high frequency signal easily degrades, jitter amplitude of a signal being input into the jitter measuring circuit is not equal to jitter amplitude of a signal injected from the outside of chip. For this reason, since jitter amplitude of a signal being really input into the jitter measuring circuit becomes uncertain, it is difficult to obtain jitter output gain with high precision.

Moreover, although jitter output gain can be obtained with high precision when a high frequency signal is input into the jitter measuring circuit without degrading signal quality, there is a problem that this method requires a great deal of design cost.

SUMMARY

Therefore, it is an advantage of some aspects of the present invention to provide a calibration apparatus, a calibration method, and a testing apparatus that can solve the foregoing problems. The above and other advantages can be achieved by combinations described in the independent claims. The dependent claims define further advantageous and exemplary combinations of the present invention.

That is, according to the first aspect of the present invention, there is provided a calibration apparatus that calibrates a jitter measuring circuit. The jitter measuring circuit includes: a jitter signal generating section that generates a jitter signal of which duration of at least one of High logic or Low logic changes according to a jitter in an input signal; and an integrating section that charges and discharges a capacitor with a predetermined electric current according to the logical value of the jitter signal to integrate the jitter signal and outputs a jitter measuring signal with a level according to an amount of jitter in the input signal, and the calibration apparatus includes: a current control section that makes the integrating section output at least one of a predetermined charging current and a predetermined discharging current for charging and discharging the capacitor; a voltage measuring section that measures voltage variation of the capacitor in a state where the charging current or the discharging current is output by the current control section; and a gain computing section that computes gain of the integrating section based on the voltage variation measured by the voltage measuring section.

According to the second aspect of the present invention, there is provided a calibration method for calibrating a jitter measuring circuit. The jitter measuring circuit includes: a jitter signal generating section that generates a jitter signal of which duration of at least one of High logic or Low logic changes according to a jitter in an input signal; and an integrating section that charges and discharges a capacitor with a predetermined electric current according to the logical value of the jitter signal to integrate the jitter signal and outputs a jitter measuring signal with a level according to an amount of jitter in the input signal, and the calibration method includes: making the integrating section output at least one of a predetermined charging current and a predetermined discharging current for charging and discharging the capacitor; measuring voltage variation of the capacitor in a state where the charging current or the discharging current is output to the integrating section; and computing gain of the integrating section based on the measured voltage variation.

According to the third aspect of the present invention, there is provided a testing apparatus that tests a device under test. The testing apparatus includes: a jitter measuring circuit that outputs a jitter measuring signal with a level according to a jitter amount of a measured signal based on the measured signal output from the device under test and a delay signal obtained by delaying the measured signal by a variable delay circuit; a deciding section that decides the good or bad of the device under test based on the jitter measuring signal; and a calibration apparatus that previously calibrates the jitter measuring circuit, and the calibration apparatus includes: a current control section that makes the integrating section output at least one of a predetermined charging current and a predetermined discharging current for charging and discharging the capacitor; a voltage measuring section that measures voltage variation of the capacitor in a state where the charging current or the discharging current is output by the current control section; and a gain computing section that computes gain of the integrating section based on the voltage variation measured by the voltage measuring section.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
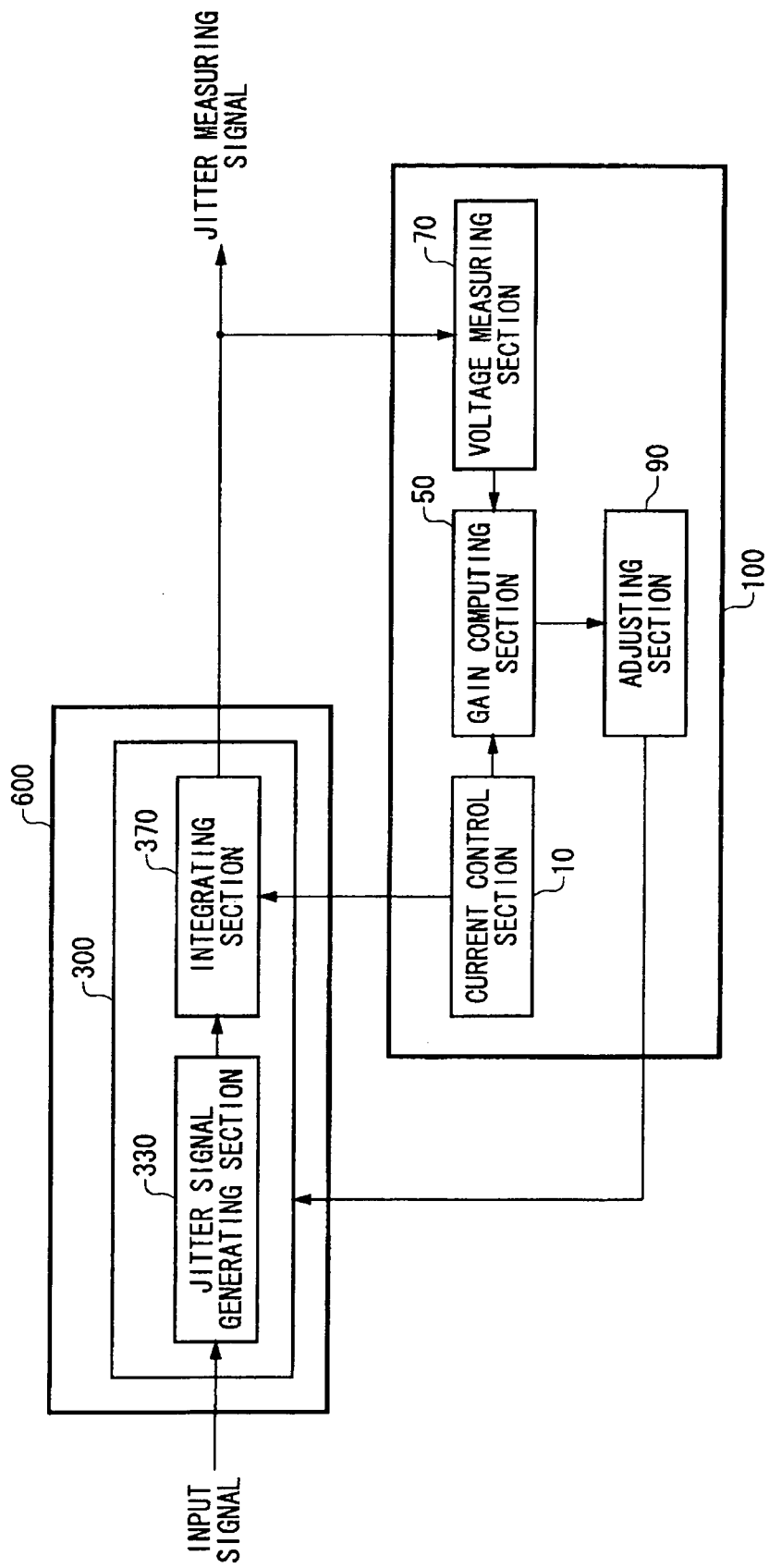
FIG. 1 is a view exemplary showing a configuration of a calibration apparatus according to an embodiment of the present invention.
Figure 2:
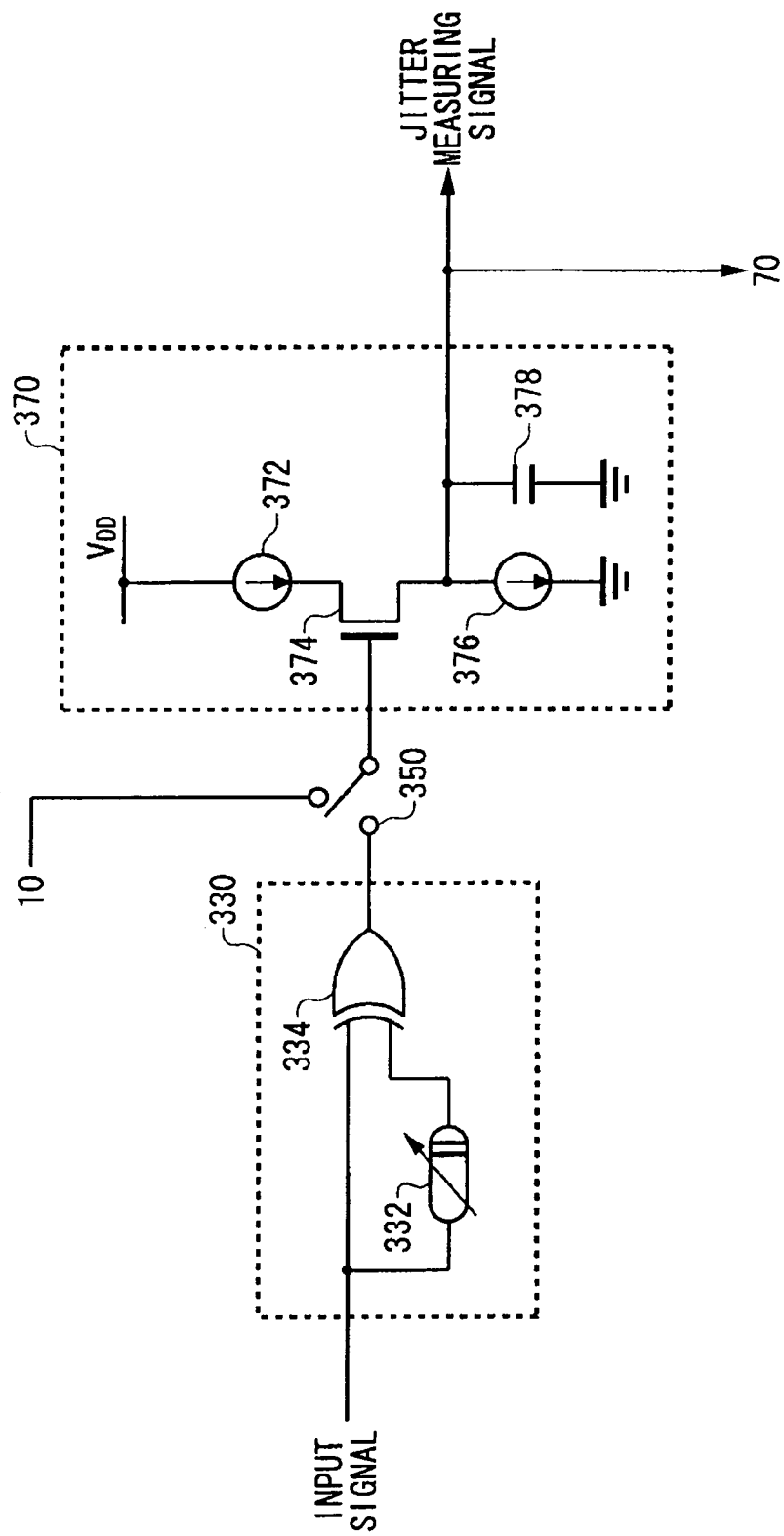
FIG. 2 is a view exemplary showing a detailed configuration of a jitter measuring circuit.

FIG. 1 is a view exemplary showing a configuration of a calibration apparatus 100 according to an embodiment of the present invention. Moreover, FIG. 2 is a view exemplary showing a detailed configuration of a jitter measuring circuit 300. The calibration apparatus 100 calibrates the jitter measuring circuit 300. Here, the jitter measuring circuit 300 is a circuit that measures amplitude (a jitter amount) of a jitter included in an input signal from a circuit under test such as a semiconductor circuit and outputs a jitter measuring signal according to this jitter amount.

First, it will be explained about a configuration of the jitter measuring circuit 300 and an operation when measuring a jitter. The jitter measuring circuit 300 includes a jitter signal generating section 330 and a integrating section 370. The jitter signal generating section 330 and the integrating section 370 are provided inside the same semiconductor package 600. The semiconductor package 600 is formed of a material such as resin for insulating an inside from an outside in order to protect an inside circuit. Moreover, signals are transmitted between the inside and the outside via terminals provided in the semiconductor package 600.

The jitter signal generating section 330 generates a jitter signal of which duration of at least one of High logic or Low logic changes according to a jitter in an input signal based on the input signal and a delay signal obtained by delaying the input signal by a delay circuit. For example, the jitter signal generating section 330 generates a jitter signal that is substantially synchronized with the input signal and of which a pulse width in each period changes in response to each of rising edge timings of the input signal.

The jitter signal generating section 330 in the present example has a variable delay circuit 332 as an example of the delay circuit and an exclusive OR circuit 334. The variable delay circuit 332 delays an input signal by a delay amount according to pulse width W of a pulse output from the jitter signal generating section 330. The exclusive OR circuit 334 outputs an exclusive OR of the input signal and a signal output from the variable delay circuit 332 as a jitter signal. However, a configuration of the jitter signal generating section 330 is not limited to this configuration. For example, the jitter signal generating section 330 can take a configuration including an AND circuit in place of the exclusive OR circuit 334.

A switch 350 selects whether a jitter signal is input into the integrating section 370 or not a control signal from the calibration apparatus 100 is input into the integrating section 370. For example, the switch 350 selects a jitter signal when measuring a jitter in an input signal and selects a control signal when calibrating the jitter measuring circuit 300. First, it will be explained about an operation of the integrating section 370 when measuring a jitter in an input signal.

The integrating section 370 integrates a jitter signal, and outputs a jitter measuring signal with a level according to an amount of jitter in the input signal. For example, the integrating section 370 may be a charge pump that charges and discharges the capacitor 378 according to times by which the jitter signal shows High logic and Low logic. As described above, since a time by which High logic or Low logic lasts in each period of the jitter signal changes according to an amount of jitter in the input signal, a level of the jitter measuring signal becomes the level according to the amount of jitter in the input signal. For example, it is possible to detect a timing jitter at a rising edge of an input signal by sampling a level of a jitter measuring signal according to the rising edge of the input signal.

The integrating section 370 demodulates the timing jitter in the input signal by integrating the jitter signal output from the jitter signal generating section 330. For example, the integrating section 370 outputs a jitter measuring signal of which a signal level increases at a predetermined increasing rate while the jitter signal output from the jitter signal generating section 330 shows High logic and of which the signal level decreases at a predetermined decreasing rate while this jitter signal shows Low logic.

By such an operation, the integrating section 370 can demodulate a timing jitter in an input signal.

The integrating section 370 in the present example has a source side current source 372, a sink side current source 376, a capacitor 378, and a charge and discharge control section 374. The source side current source 372 generates a source current prescribing the above-described increasing rate of the jitter measuring signal, the sink side current source 376 generates a sink current prescribing the above-described decreasing rate of the jitter measuring signal.

The capacitor 378 is charged and discharged by the source side current source 372 and the sink side current source 376 in order to generate a voltage level of the jitter measuring signal. Moreover, the charge and discharge control section 374 charges the capacitor 378 with an electric current obtained by subtracting the sink current from the source current while the jitter signal shows High logic and discharges the capacitor 378 with the sink current while the jitter signal shows Low logic.

By such a configuration, it is possible to generate a jitter measuring signal obtained by demodulating a timing jitter in an input signal. However, a configuration of the integrating section 370 is not limited to this configuration.

For example, although the capacitor 378 is connected to a connecting point between the charge and discharge control section 374 and the sink side current source 376 in the present example, the capacitor 378 may be connected to a connecting point between the charge and discharge control section 374 and the source side current source 372 in another example. In this case, the charge and discharge control section 374 discharges the capacitor with an electric current obtained by subtracting the source current from the sink current while the jitter signal shows High logic and charges the capacitor 378 with the source current while the jitter signal shows Low logic.

Figure 3:
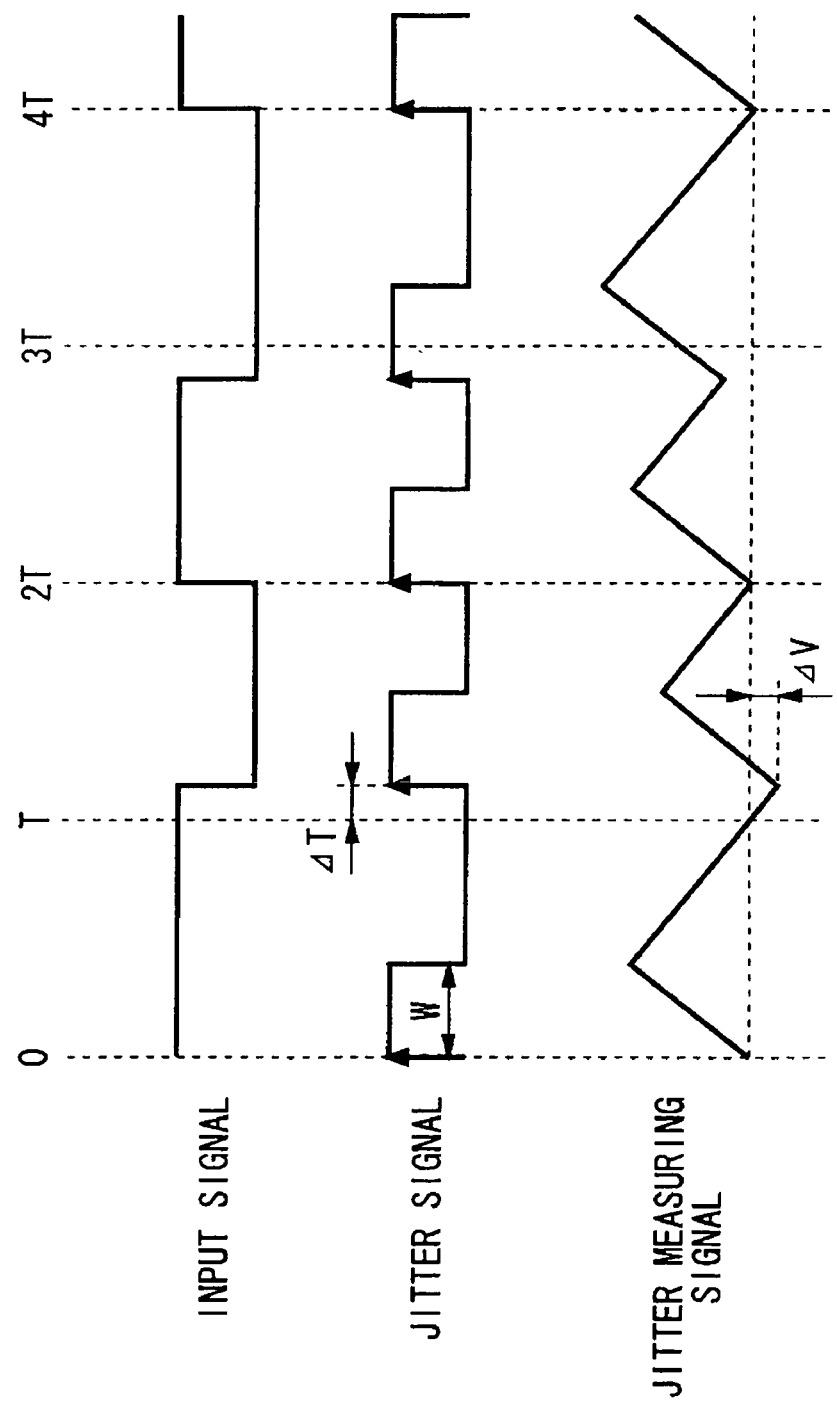
FIG. 3 is a view exemplary showing an operation when a jitter measuring circuit measures a jitter in an input signal.

FIG. 3 is a view exemplary showing an operation when the jitter measuring circuit 300 measures a jitter in an input signal. As described above, the integrating section 370 outputs a jitter measuring signal of which a signal levels increases at a predetermined increasing rate while the jitter signal shows High logic and of which the signal level decreases at a predetermined decreasing rate while the jitter signal shows Low logic.

The integrating section 370 previously adjusts current values of the source side current source 372 and the sink side current source 376 so that an extreme value of the jitter measuring signal becomes a predetermined level when the input signal does not have a jitter. For example, a current value is previously adjusted so that a minimum value becomes a substantially zero level and a maximum value becomes a constant level.

When an input signal having a timing jitter is given after this adjustment has been performed, the extreme value of the jitter measuring signal has a difference ΔV according to a jitter amount ΔT for this predetermined level as shown in FIG. 3. That is to say, the jitter measuring signal shows a signal level according to the jitter amount included in the input signal. It is possible to compute a timing jitter ΔT by dividing the difference ΔV by gain of the jitter measuring circuit 300.

Moreover, the integrating section 370 may further have a sampling and holding circuit that samples and holds the signal level of the jitter measuring signal at a predetermined timing. The sampling and holding circuit may pass and output the jitter measuring signal while the signal output from the jitter signal generating section 330 shows High logic, and may hold and output the signal level of the jitter measuring signal while the signal output from the jitter signal generating section 330 shows Low logic.

Next, it will be described about a configuration and an operation of the calibration apparatus 100 shown in FIG. 1. The calibration apparatus 100 measures jitter output gain of the jitter measuring circuit 300. For example, jitter output gain is a ratio of a signal level of a jitter measuring signal to a jitter amount included in an input signal of the jitter measuring circuit 300.

The calibration apparatus 100 includes a current control section 10, a gain computing section 50, a voltage measuring section 70, and an adjusting section 90. The calibration apparatus 100 may be provided outside the semiconductor package 600.

The current control section 10 makes the integrating section 370 output at least one of a predetermined charging current and a predetermined discharging current for charging and discharging the capacitor 378. The current control section 10 in the present example inputs a control signal into the switch 350. Moreover, the current control section 10 controls the switch 350 to make the switch select a control signal from the current control section 10 and input the control signal into the integrating section 370.

For example, the current control section 10 inputs a High-logic control signal to the integrating section 370 with a configuration shown in FIG. 2 when outputting a charging current and inputs a Low-logic control signal to the integrating section 370 when outputting a discharging current.

The voltage measuring section 70 measures voltage variation of the capacitor 378 in a state where the current control section 10 makes the integrating section 370 output a charging current or a discharging current. In other words, the voltage measuring section 70 measures a change amount per a unit time of a voltage of the capacitor 378. The gain computing section 50 computes jitter output gain of the integrating section 370 based on the voltage variation measured by the voltage measuring section 70.

The jitter signal generating section 330 transmits a timing jitter with a transfer function s because the jitter signal generating section outputs a difference between timing jitters at adjacent two edges of the input signal. Here, s shows Laplace transform. Moreover, since the integrating section 370 integrates the difference between timing jitters and transforms the timing jitter into a voltage by means of a proportional constant I/C, the integrating section 370 transmits the timing jitter with a transfer function I/(C·s). Here, I is a current value of the charging and discharging current and C is a capacitance value of the capacitor 378. Moreover, when the values of a charging current and a discharging current are different, I may be a mean value of the charging current and the discharging current.

From the above, jitter output gain G (i.e., a jitter transfer function) of the jitter measuring circuit 300 is expressed with the following expression.

$$G = s \cdot I/(C \cdot s) = I/C$$

That is to say, the gain of the jitter measuring circuit 300 is determined by a ratio between the charging and discharging current value in the integrating section 370 and the capacitance value of the capacitor 378. On the other hand, when charging and discharging the capacitor 378 with the charging and discharging current I, a capacitor voltage v(t) is given by the following expression.

$$v(t) = t \cdot I/C$$

Therefore, it is possible to obtain jitter output gain of the jitter measuring circuit 300 from a change amount per a unit time of a voltage of the capacitor 378, which is measured by the voltage measuring section 70. Moreover, since jitter output gain can be obtained without sending and receiving a high-frequency signal via the semiconductor package 600, it is possible to obtain jitter output gain with high precision.

Moreover, when the input signal without jitter is input into the jitter measuring circuit 300, the adjusting section 90 may previously adjust current values of the source side current source 372 and the sink side current source 376 so that the level of the jitter measuring signal shows a substantially constant value.

For example, the adjusting section 90 may adjust current values in the source side current source 372 and the sink side current source 376 so that levels of a maximum value and a minimum value of the jitter measuring signal shown in FIG. 3 respectively becomes substantially constant.

The calibration apparatus 100 may further have a function for generating an input signal without a jitter and inputting the generated signal into the jitter measuring circuit 300. In this case, it is preferable that an apparatus for generating an input signal without a jitter is provided inside the semiconductor package 600. The adjusting section 90 may make this apparatus generate the input signal and input the generated signal into the jitter measuring circuit 300.

Moreover, the adjusting section 90 may adjust the jitter measuring circuit 300 based on the gain computed from the gain computing section 50. For example, the adjusting section 90 may adjust the jitter measuring circuit 300 so that the gain of the jitter measuring circuit 300 becomes a predetermined value. In this case, the adjusting section 90 may adjust at least one of a charging current or a discharging current in the integrating section 370.

Moreover, the adjusting section 90 may inform the jitter measuring circuit 300 of the computed gain. The jitter measuring circuit 300 may further include a register for storing the informed gain. An outside apparatus can compute an amount of jitter in an input signal by receiving a jitter measuring signal and this gain from the jitter measuring circuit 300.

Figure 4:
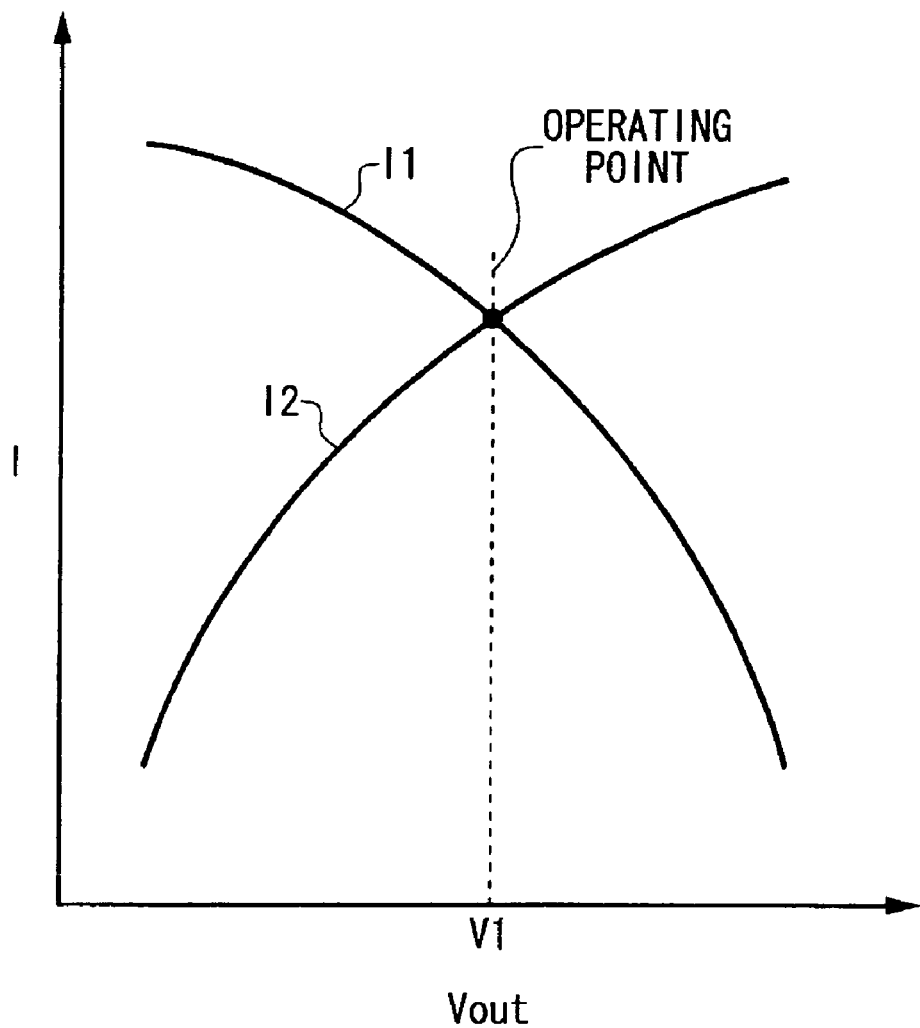
FIG. 4 is a view exemplary showing characteristics of a charging current I1 and a discharging current I2 for a voltage Vout of a capacitor.

FIG. 4 is a view exemplary showing characteristics of a charging current I1 and a discharging current I2 for a voltage Vout of the capacitor 378. When characteristics of the source side current source 372 and the sink side current source 376 are ideal, the charging current I1 and the discharging current I2 become a substantially constant current value even if the capacitor voltage Vout changes. In this case, a time change rate of the capacitor voltage becomes constant regardless of a voltage value of the capacitor. For this reason, the gain of the jitter measuring circuit 300 can be obtained from the time change rate of the voltage Vout of the capacitor 378 in arbitrary capacitor voltage Vout in a state where the capacitor 378 is charged and discharged.

However, when characteristics of the source side current source 372 and the sink side current source 376 are not ideal, the current values of the source side current source 372 and the sink side current source 376 change according to the voltage Vout of the capacitor 378. For this reason, the current values of the charging current I1 and the discharging current I2 change according to the voltage Vout of the capacitor 378. In this case, the time change rate of the voltage Vout of the capacitor 378 changes according to the value of voltage Vout of the capacitor 378.

The gain computing section 50 may compute jitter output gain of the jitter measuring circuit 300 based on the time change rate of the voltage Vout of the capacitor 378 at a predetermined operating point. A predetermined operating point is a point at which the voltage Vout of the capacitor 378 becomes a predetermined voltage value.

The gain computing section 50 may compute gain based on the time change rate of the voltage Vout when any one of the voltage Vout of the capacitor 378, the charging current I1, and the discharging current I2 or a combination of them satisfies a predetermined condition. For example, the gain computing section 50 may compute gain based on the time change rate of the voltage Vout of the capacitor 378 at an operating point at which the voltage Vout of the capacitor 378 is generally one-half of a power source voltage VDD of the source side current source 372.

Moreover, the gain computing section 50 may compute gain using a voltage V1, when a waveform of the charging current I1 and a waveform of the discharging current I2 shown in FIG. 4 are crossed, as an operating point. In this case, it is preferable that the calibration apparatus 100 further includes a function for measuring characteristics of the charging current I1 and the discharging current I2 for the voltage Vout of the capacitor 378.

Moreover, the voltage measuring section 70 may measure a first time waveform of the voltage of the capacitor 378 when the capacitor 378 is discharged from a state where electric charges accumulated in the capacitor 378 have been substantially saturated to a state where electric charges accumulated in the capacitor 378 become substantially zero and a second time waveform of the voltage of the capacitor 378 when the capacitor 378 is charged from a state where electric charges accumulated in the capacitor 378 are substantially zero to a state where electric charges accumulated in the capacitor 378 are substantially saturated. In this case, the gain computing section 50 may compute gain based on the time change rate of the voltage Vout of the capacitor 378 at a point at which the first time waveform is crossed with the voltage value V1 at a predetermined operating point. Moreover, the gain computing section 50 may compute gain based on the time change rate of the voltage Vout of the capacitor 378 at a point at which the second time waveform is crossed with the voltage value V1 at a predetermined operating point.

Figure 5:
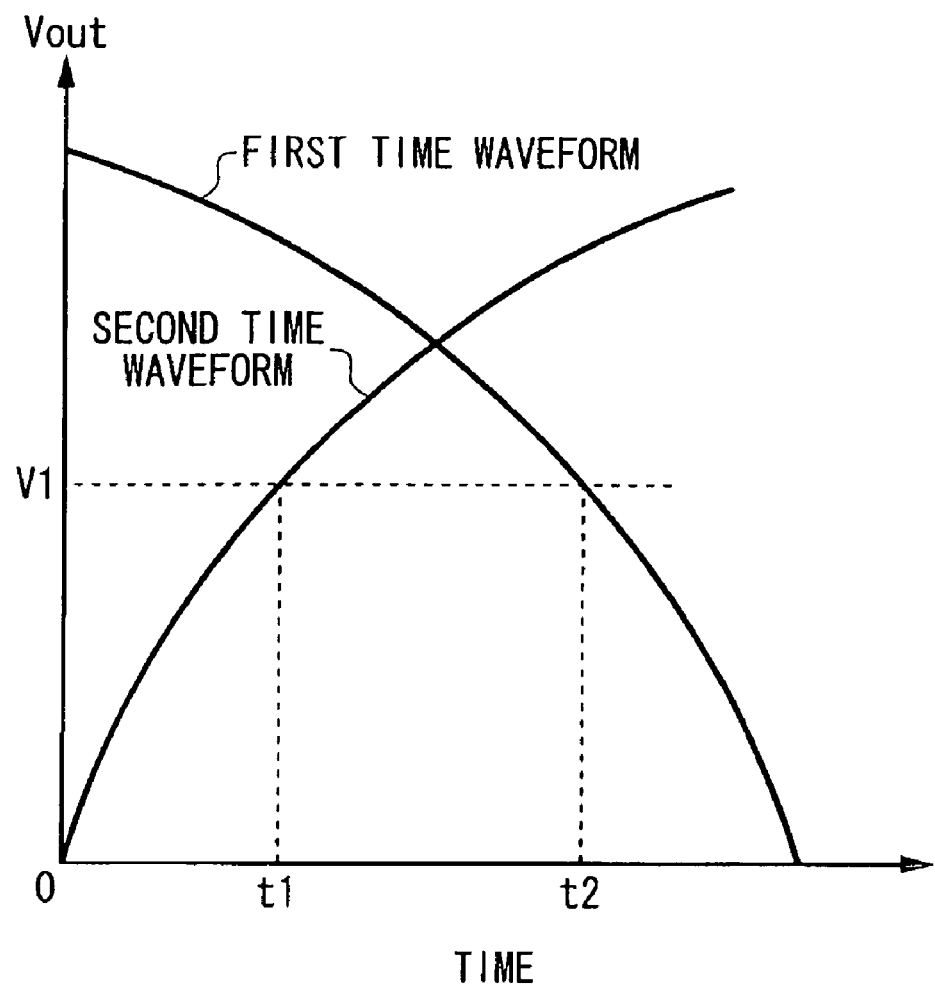
FIG. 5 is a view exemplary showing a first time waveform and a second time waveform.

FIG. 5 is a view exemplary showing the first time waveform and the second time waveform. The current control section 10 discharges the capacitor 378 from a state where electric charges accumulated in the capacitor 378 have been substantially saturated to a state where electric charges accumulated in the capacitor 378 become substantially zero, and the voltage measuring section 70 measures the first time waveform of the voltage Vout of the capacitor 378 at this time. Moreover, the current control section 10 charges the capacitor 378 from a state where electric charges accumulated in the capacitor 378 are substantially zero to a state where electric charges accumulated in the capacitor 378 are substantially saturated, and the voltage measuring section 70 measures the second time waveform of the voltage Vout of the capacitor 378 at this time. In FIG. 5, a horizontal axis shows an elapsed time from the start time of charging and discharging in a state where electric charges in the capacitor 378 are substantially zero or are substantially saturated.

As described above, the gain computing section 50 may compute gain based on the time change rate of the voltage Vout of the capacitor 378 at a point at which the first time waveform and the second time waveform are crossed with the voltage V1 at a predetermined operating point. In other words, when assuming that the first time waveform is f(t) and the second time waveform is g(t), the gain computing section 50 may compute gain based on the time change rate of the voltage Vout at an operating point (t1, V1) at which f(t1)=V1 and an operating point (t2, V1) at which g(t2)=V1. At this time, the gain computing section 50 may compute gain based on an absolute value of a derivative value f'(t1) of the first time waveform, may compute gain based on an absolute value of a derivative value g'(t2) of the second time waveform, or may compute gain based on a mean value of the absolute values of f'(t1) and g'(t2).

By such an operation, it is possible to compute gain at an operating point V1 of the jitter measuring circuit 300 with high precision.

Moreover, the calibration apparatus 100 may further include means for applying a voltage at an operating point used for calibration to the capacitor 378. In other words, when the jitter measuring circuit 300 measures a jitter in an input signal, this means previously sets an initial voltage of the capacitor 378 to the voltage at this operating point. When the input signal has a jitter, a difference between the initial voltage and a voltage of an extreme value in the jitter measuring signal shown in FIG. 3 corresponds to a jitter amount.

Figure 6:
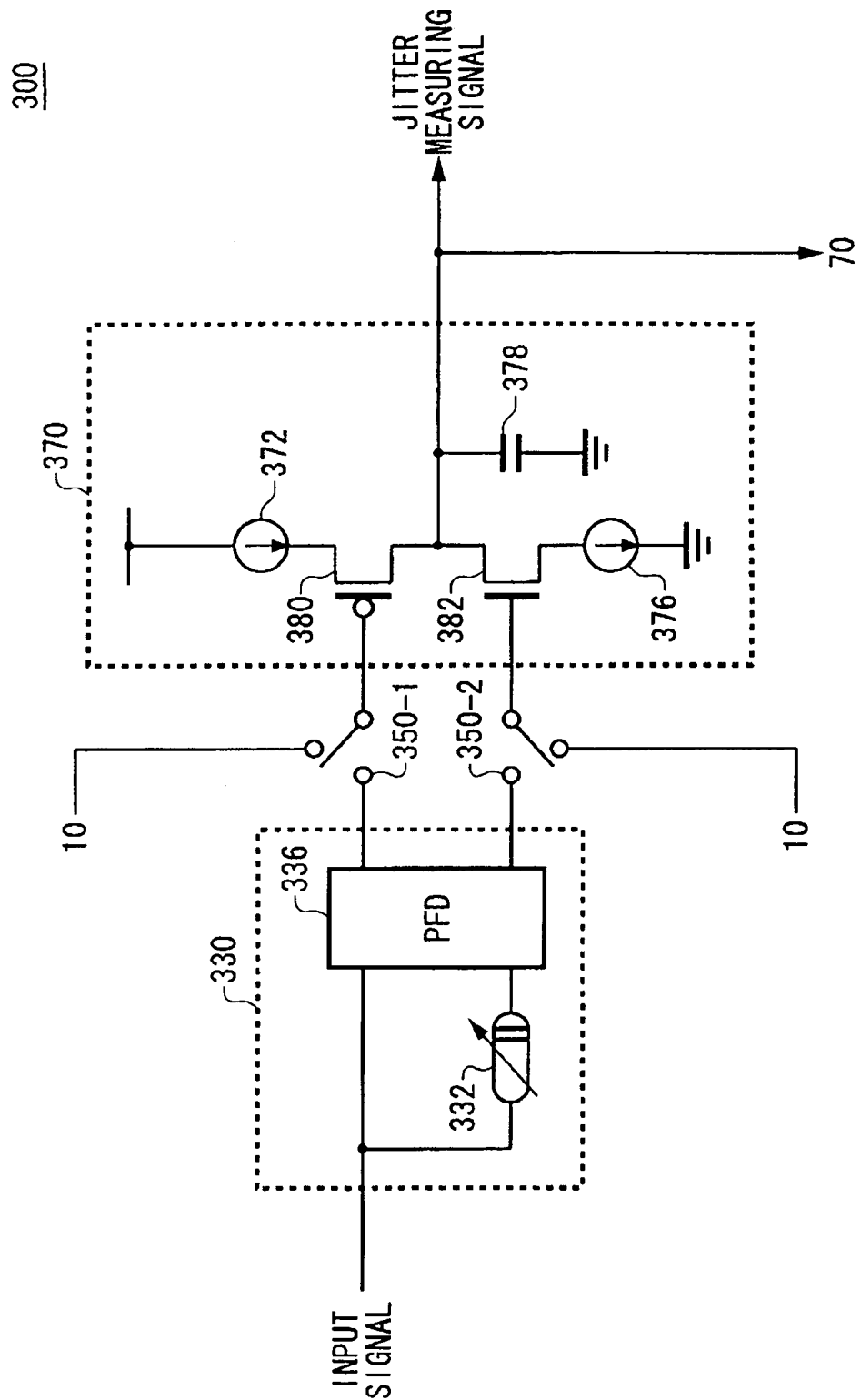
FIG. 6 is a view showing another example of a configuration of a jitter measuring circuit.

FIG. 6 is a view showing another example of a configuration of a jitter measuring circuit 300. The jitter signal generating section 330 in the present example has a variable delay circuit 332 and a phase frequency detector 336. The variable delay circuit 332 delays an input signal by integral multiple of a period of the input signal.

The phase frequency detector 336 outputs a signal with a pulse width according to a phase difference between the corresponding edges in two given signals. When a delay amount in the variable delay circuit 332 is a delay amount substantially equal to one period of an input signal, the phase frequency detector 336 outputs a jitter signal to gate terminals of a charge control section 380 and a discharge control section 382. Here, the jitter signal has a pulse width according to a phase difference between a phase of each edge of the input signal and a phase of an edge in a period prior to this edge. The phase frequency detector 336 may generate a jitter signal substantially equal to the jitter signal shown in FIG. 3.

A first switch 350-1 and a second switch 350-2 select whether the jitter signal is input into the integrating section 370 or not the control signal from the calibration apparatus 100 is input into the integrating section 370. For example, the first switch 350-1 and the second switch 350-2 select the jitter signal when measuring the jitter in the input signal and select the control signal when calibrating the jitter measuring circuit 300.

When calibrating the jitter measuring circuit 300, the current control section 10 inputs the control signal into the first switch 350-1 and the second switch 350-2. Moreover, the current control section 10 makes the first switch 350-1 and the second switch 350-2 select the control signal from the current control section 10 and input the selected signal into the integrating section 370. For example, the current control section 10 may input a Low-logic control signal into the first switch 350-1 and the second switch 350-2 when charging the capacitor 378, and input a High-logic control signal into the first switch 350-1 and the second switch 350-2 when discharging the capacitor 378.

The integrating section 370 in the present example has a source side current source 372, a sink side current source 376, the capacitor 378, the charge control section 380, and the discharge control section 382. The source side current source 372, the sink side current source 376, and the capacitor 378 have functions similar to those of the components with the same reference numerals in FIG. 2.

The charge control section 380 switches whether the capacitor 378 is charged by the source side current source 372 according to the jitter signal. Moreover, the discharge control section 382 switches whether the capacitor 378 is discharged by the sink side current source 376 according to the jitter signal.

The charge control section 380 and the discharge control section 382 are, e.g., FET and have polarities different from each other. For example, the charge control section 380 and the discharge control section 382 receive the jitter signal through gate terminals, the charge control section 380 charges the capacitor 378 when the jitter signal shows Low logic, and the discharge control section 382 discharges the capacitor 378 when the jitter signal shows High logic.

By such a configuration, it is possible to generate a jitter measuring signal obtained by demodulating a jitter in an input signal. Then, the calibration apparatus 100 can compute gain of the jitter measuring circuit 300. The function and configuration of the calibration apparatus 100 are similar to those of the calibration apparatus 100 described with reference to FIG. 1. In addition, the jitter measuring circuit 300 may be a configuration obtained by combining the jitter signal generating section 330 shown in FIG. 2 and the integrating section 370 shown in FIG. 6, or may be a configuration obtained by combining the jitter signal generating section 330 shown in FIG. 6 and the integrating section 370 shown in FIG. 2.

Figure 7:
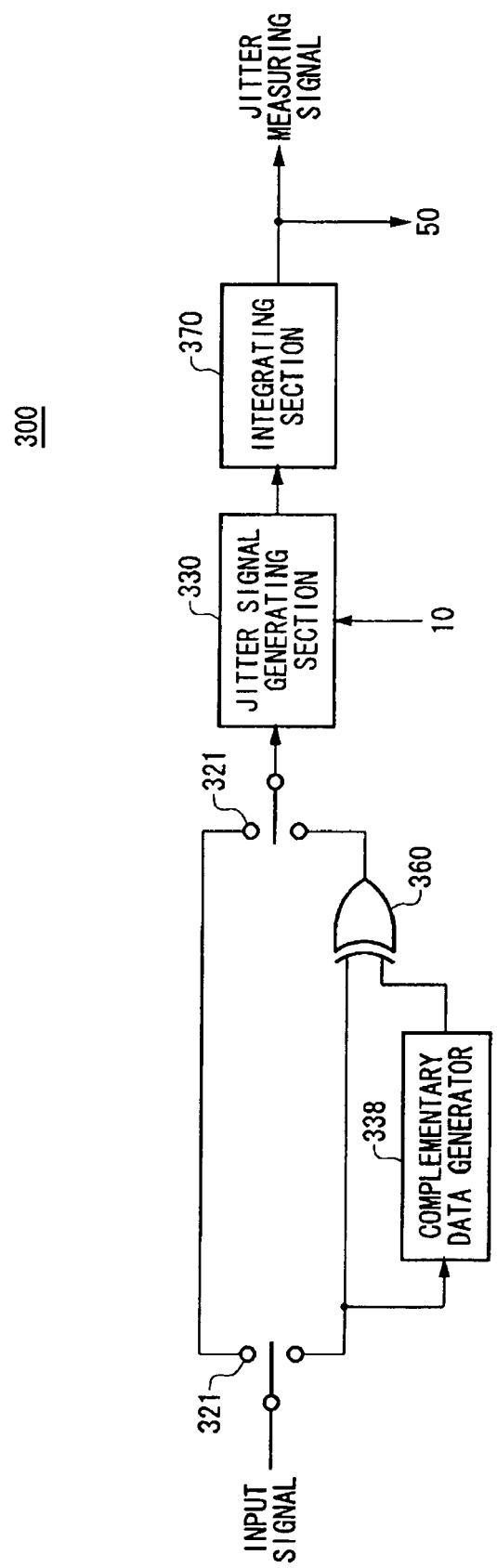
FIG. 7 is a view showing another example of a configuration of a jitter measuring circuit.

FIG. 7 is a view showing another example of a configuration of a jitter measuring circuit 300. In the present example, an input signal is a data signal, and the jitter measuring circuit 300 demodulates a jitter in this data signal. The jitter measuring circuit 300 in the present example has a complementary data generator 338, an exclusive OR circuit 360, and a switch 321 in addition to a configuration of the jitter measuring circuit 300 described in FIG. 2 or 6.

The complementary data generator 338 generates a complementary data signal of which a data value transits at a bit boundary at which a data value of a data signal does not transit. Examples of an operation and a configuration of the complementary data generator 338 are described below in FIGS. 8 and 9.

The exclusive OR circuit 360 outputs an exclusive OR of a data signal and a complementary data signal. Since a data value of a complementary data generating signal transits at a bit boundary at which a data value of a data signal does not transit, an exclusive OR of the complementary data generating signal and the data signal becomes a clock signal having an edge at each bit boundary of the data signal.

Here, a clock signal is a signal having an edge in a substantially constant period, and a data signal is a signal that does not necessarily have an edge in a substantially constant period.

The switch 321 selects either of the input signal or the signal output from the exclusive OR circuit 360 to input the selected signal into the jitter signal generating section 330. For example, the switch 321 selects the signal output from the exclusive OR circuit 360 when the input signal is a data signal and selects the input signal when the input signal is a clock signal, in order to input the selected signal into the jitter signal generating section 330.

By such a configuration, the jitter measuring circuit 300 can measure a jitter in a data signal. Moreover, even in case of the jitter measuring circuit 300 in the present example, the calibration apparatus 100 can compute gain of the integrating section 370. The function and configuration of the calibration apparatus 100 are similar to those of the calibration apparatus 100 described with reference to FIG. 1.

Figure 8:
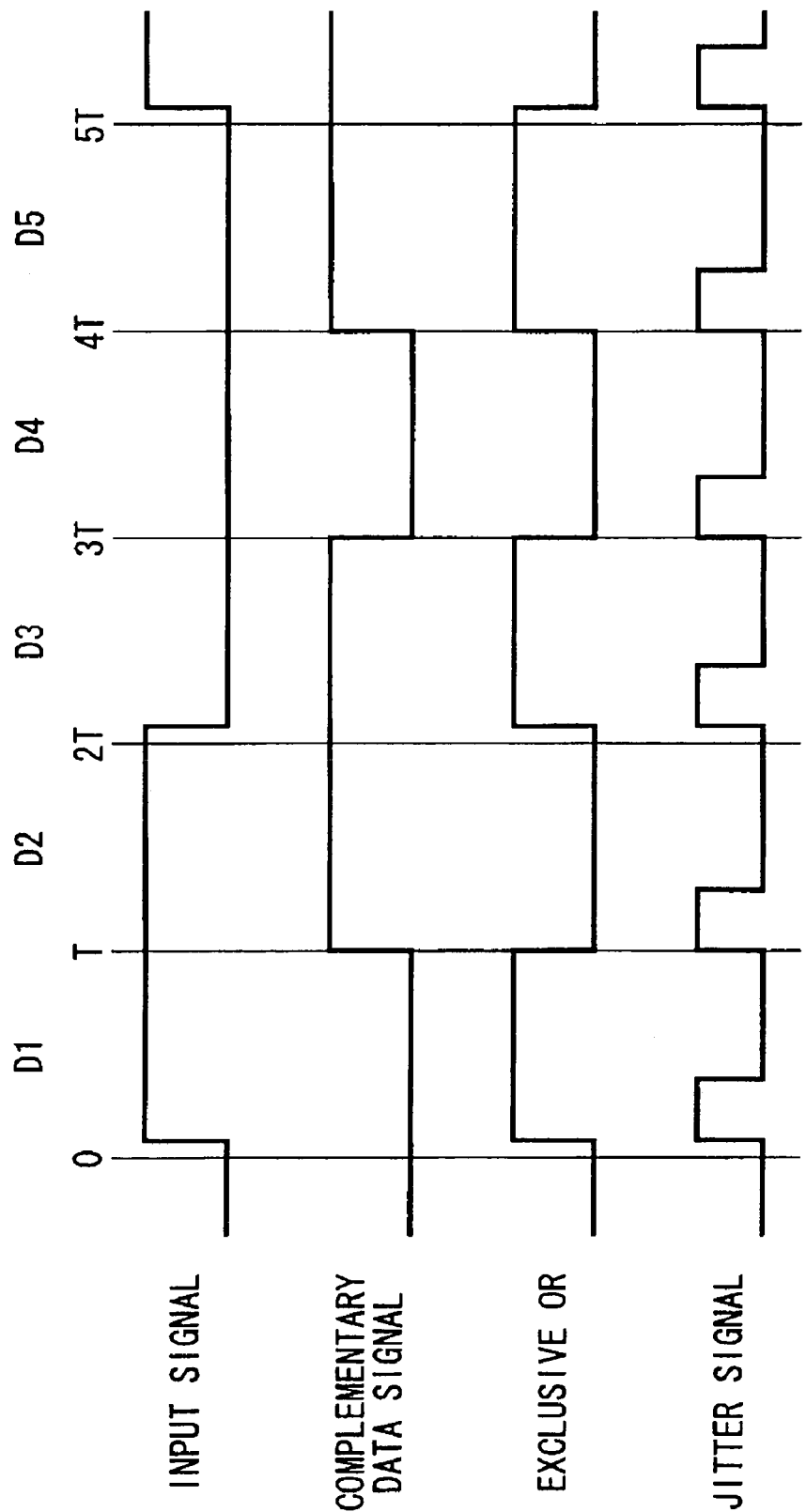
FIG. 8 is a timing chart exemplary showing an operation of a complementary data generator.

FIG. 8 is a timing chart exemplary showing an operation of the complementary data generator 338. The complementary data generator 338 receives an input signal (a data signal), and generates a complementary data signal for the input signal. A complementary data signal is a signal of which edges are provided on condition that a data value of an input signal does not transit at a boundary between data sections every boundary of the data sections in the input signal. For example, when an edge of the input signal and an edge of the complementary data signal are ranked on the same time base, the complementary data signal may be a signal in which these edges are arranged at the generally same time interval. Moreover, data section of an input signal means, e.g., a hold time of one data that is not continued in the serially-transmitted input signal. Moreover, data section of an input signal may mean a hold time of symbol data in the input signal that has multiple values and is transmitted. In other words, data section may be an interval between bits of the input signal, or may be an interval between symbols. For example, in FIG. 8, data section of an input signal is T, and a data pattern for the time (0-6T) is 110001.

In an example shown in FIG. 8, sections (0-T, T-2T, 3T-4T, . . . ) correspond to data sections (D1, D2, D3, . . . ). Moreover, boundaries between these data sections (0, T, 2T, 3T, . . . ). In the present example, the data value of input signal transits at boundaries between the data sections (0, 2T, 5T), and the data value of input signal does not transit at boundaries between the data sections (T, 3T, 4T). For this reason, the complementary data generator 338 generates a complementary data signal having edges at the boundaries (T, 3T, 4T) between the data sections at which the input signal does not have edges.

Since the input signal has a substantially constant data section, timings of edges of the input signal are the generally same as either of timings (0, T, 2T, . . . ). In this case, it is preferable that the complementary data generator 338 generates a complementary data signal having an edge at a boundary between the data sections not having the edges of the input signal. In this way, considering both-side edges of the input signal and the complementary data signal, the edges are arranged at a substantially constant interval. By such an operation, the jitter measuring circuit 300 can operate at a substantially constant interval, and can reduce the output variation by a difference of an operation interval to demodulate a jitter with high precision.

The exclusive OR circuit 360 outputs an exclusive OR of the input signal and the complementary data signal. In this way, it is possible to generate a signal of which edges are arranged at a substantially constant interval. Then, a jitter component in the input signal is preserved in this signal.

Figure 9:
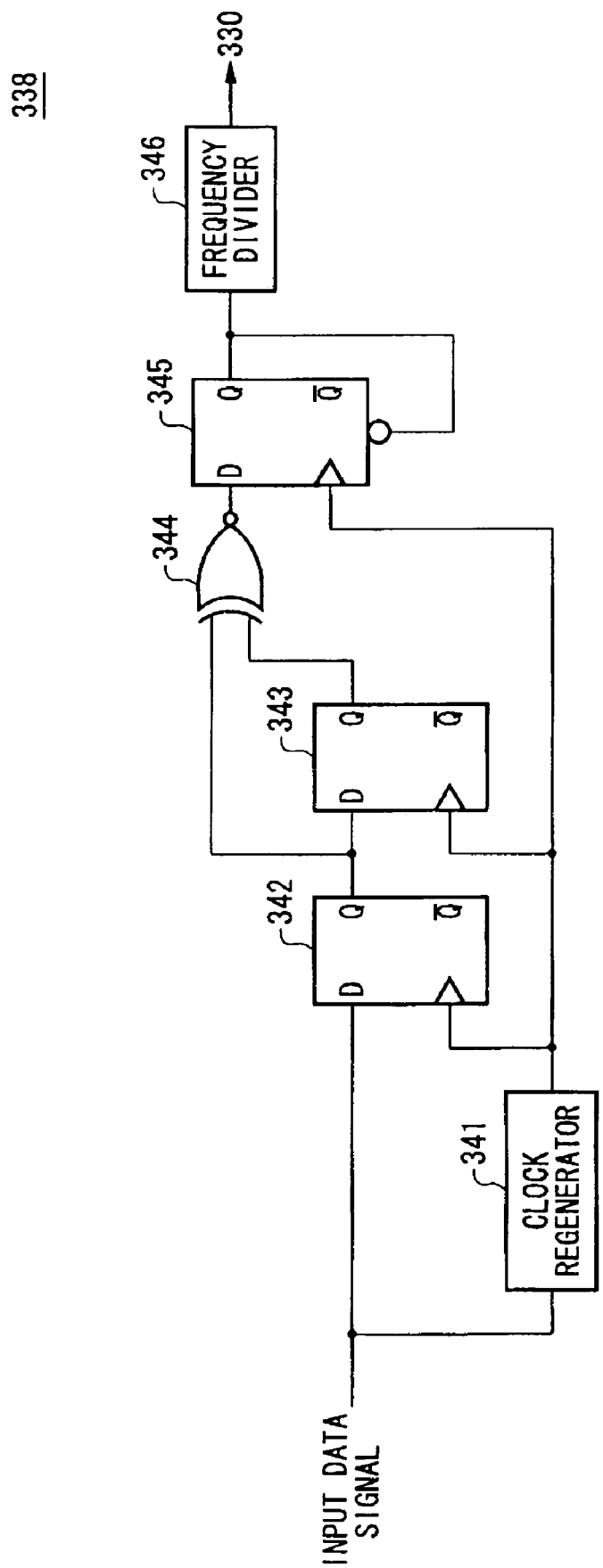
FIG. 9 is a view exemplary showing a configuration of a complementary data generator.

FIG. 9 is a view exemplary showing a configuration of the complementary data generator 338. The complementary data generator 338 in the present example has a clock regenerator 341, a first D flip-flop 342, a second D flip-flop 343, an accordance detector 344, a third D flip-flop 345, and a frequency divider 346.

The clock regenerator 341 generates a clock signal having a period substantially equal to the data section of input signal based on the input signal. The first D flip-flop 342 acquires the input signal according to this clock signal, and outputs the acquired signal.

The second D flip-flop 343 acquires the signal output from the first D flip-flop 342 according to this clock signal, and outputs the acquired signal. In other words, the second D flip-flop 343 delays the signal output from the first D flip-flop 342 by one period of the data section of the input signal, and outputs the delayed signal.

The accordance detector 344 outputs an accordance signal showing High logic when a signal value output from the first D flip-flop 342 and a signal value output from the second D flip-flop 343 are identical with each other.

The third D flip-flop 345 acquires the signal output from the accordance detector 344 according to this clock signal and outputs the acquired signal, and inside data are reset by this output signal. In other words, if the signal received from the accordance detector 344 shows High logic when the third D flip-flop 345 receives a rising edge of this clock signal, the third D flip-flop 345 outputs a pulse with a fine pulse width shorter than the data section of input signal.

The frequency divider 346 divides the frequency of signal output from the third D flip-flop 345 by two, and generates a complementary data signal. Here, dividing frequency by two means generating a signal of which a logical value transits according to either of a rising edge or a falling edge of the signal output from the third D flip-flop 345.

By such a configuration, it is possible to easily generate a complementary data signal of an input signal. Moreover, a configuration of the complementary data generator 338 is not limited to this configuration example. The complementary data generator 338 can have various configurations. For example, the complementary data generator 338 may obtain and output a clock signal by an operation based on digital data obtained by sampling the input signal.

Figure 10:
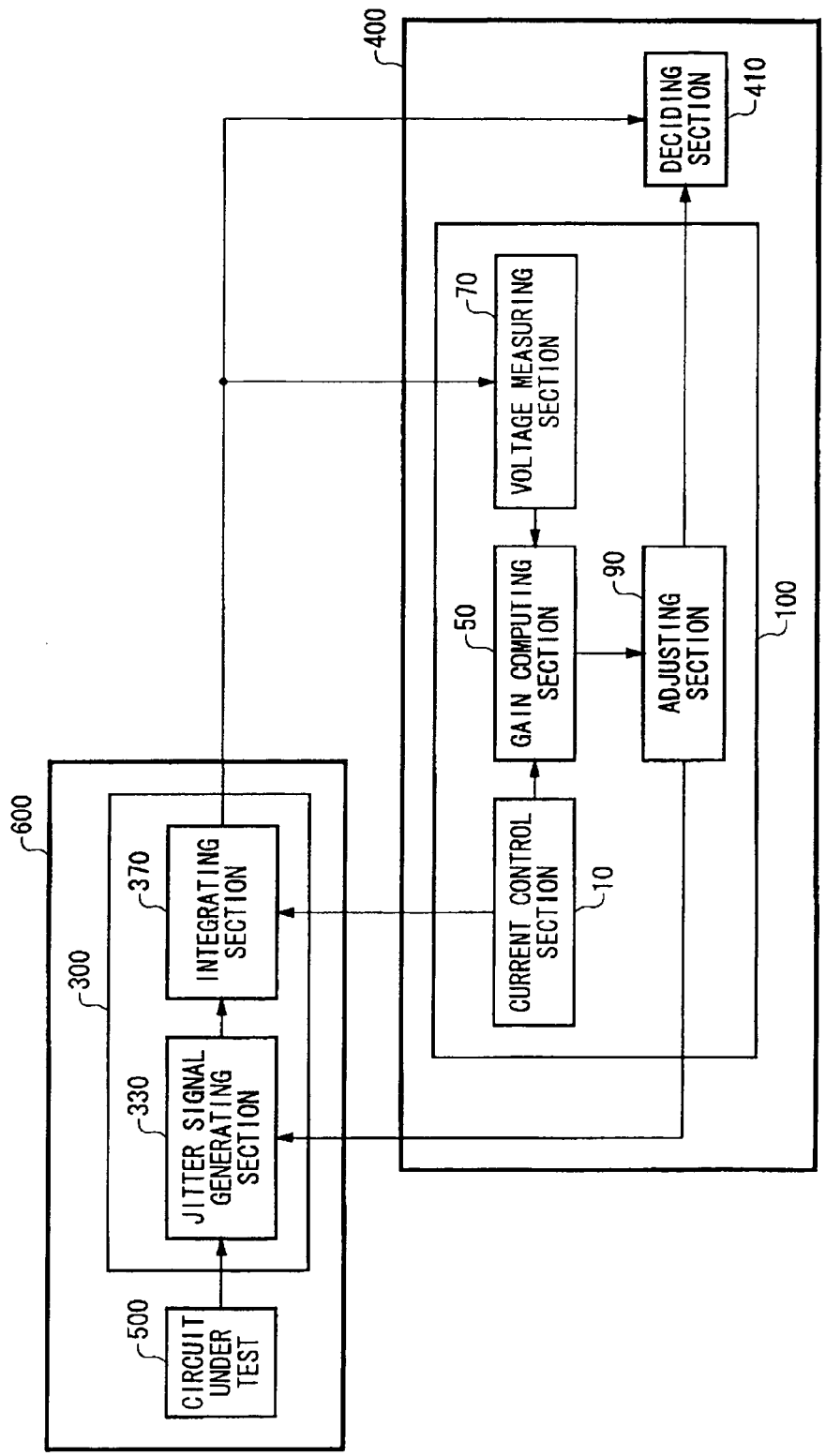
FIG. 10 is a view exemplary showing a configuration of a testing apparatus according to an embodiment of the present invention.

FIG. 10 is a view exemplary showing a configuration of a testing apparatus 400 according to an embodiment of the present invention. The testing apparatus 400 is an apparatus for testing a circuit under test 500 such as a semiconductor circuit, and includes a calibration apparatus 100 and a deciding section 410. Moreover, the circuit under test 500 is provided inside the semiconductor package 600 equal to the jitter measuring circuit 300. The jitter measuring circuit 300 and the calibration apparatus 100 are equal to the jitter measuring circuit 300 and the calibration apparatus 100 described in FIGS. 1 to 9.

The calibration apparatus 100 previously measures gain of the jitter measuring circuit 300. After the calibration apparatus 100 has computed the gain of the jitter measuring circuit 300, the jitter measuring circuit 300 outputs a jitter measuring signal according to a jitter of a measured signal output from the circuit under test 500.

The deciding section 410 decides the good or bad of the circuit under test 500 based on the jitter measuring signal output from the jitter measuring circuit 300. For example, the deciding section 410 may compute the jitter of the measured signal by dividing a level of the jitter measuring signal by the gain informed from the adjusting section 90. The deciding section 410 may decide the good or bad of the circuit under test 500 according to whether the jitter of the measured signal is larger than a predetermined value.

As described above, although the jitter measuring circuit 300 is provided inside the semiconductor package 600, the calibration apparatus 100 can compute jitter output gain of the jitter measuring circuit 300 with high precision. For this reason, it is possible to decide the good or bad of the circuit under test 500 with high precision.

As apparent from the above descriptions, according to the above embodiments, it is possible to compute jitter output gain of the jitter measuring circuit 300 with high precision. Moreover, it is possible to decide the good or bad of the circuit under test 500 with high precision.

Particularly, when the jitter measuring circuit 300 is provided inside the semiconductor package 600 equal to the circuit under test 500, it is possible to compute jitter output gain of the jitter measuring circuit 300 with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A calibration apparatus that calibrates a jitter measuring circuit, the jitter measuring circuit comprising:
   a jitter signal generating section that generates a jitter signal of which duration of at least one of High logic or Low logic changes according to a jitter in an input signal; and
   an integrating section that charges and discharges a capacitor with a predetermined electric current according to the logical value of the jitter signal to integrate the jitter signal and outputs a jitter measuring signal with a level according to an amount of jitter in the input signal, and
   the calibration apparatus comprising:
   a current control section that makes the integrating section output at least one of a predetermined charging current and a predetermined discharging current for charging and discharging the capacitor;
   a voltage measuring section that measures voltage variation of the capacitor in a state where the charging current or the discharging current is output by the current control section; and
   a gain computing section that computes gain of the integrating section based on the voltage variation measured by the voltage measuring section.

2. The calibration apparatus as claimed in claim 1, wherein
the integrating section has a source side current source for generating the charging current and a sink side current source for generating the discharging current, the source side current source and the sink side current source have a characteristic that a current value changes according to a voltage of the capacitor,
the current control section discharges the capacitor or charges the capacitor from a state where a quantity of electric charges accumulated in the capacitor is substantially saturated or a state where a quantity of electric charges accumulated in the capacitor is substantially zero, and
the voltage measuring section measures voltage variation of the capacitor from a state where a quantity of electric charges accumulated in the capacitor is substantially saturated or a state where a quantity of electric charges accumulated in the capacitor is substantially zero.

3. The calibration apparatus as claimed in claim 2, wherein the gain computing section computes gain based on the voltage variation of the capacitor at an operating point of the integrating section.

4. The calibration apparatus as claimed in claim 1, wherein
the jitter signal generating section generates a jitter signal of which duration of one side of High logic or Low logic changes according to the jitter in the input signal,
the integrating section has a source side current source for supplying the predetermined charging current to the capacitor according to a logical value of one side of the jitter signal and a sink side current source for pulling up the predetermined discharging current from the capacitor according to the other side of the jitter signal,
the current control section connects the source side current source or the sink side current source, which is controlled with the logical value of the jitter signal of which duration changes according to the jitter in the input signal, and the capacitor, and
the voltage measuring section measures voltage variation of the capacitor in a state where the current control section connects the source side current source or the sink side current source and the capacitor.

5. The calibration apparatus as claimed in claim 4, further comprising an adjusting section that previously adjusts current values of the source side current source and the sink side current source so as to show that a level of the jitter measuring signal has a substantially constant value when the input signal without jitter is input into the jitter measuring circuit.

6. The calibration apparatus as claimed in claim 1, wherein
the jitter measuring circuit is formed inside a semiconductor package, and
the current control section supplies a control signal, by which at least one of the predetermined charging current and the predetermined discharging current for charging and discharging the integrating section is output, from an outside of the semiconductor package to the capacitor.

7. A calibration method for calibrating a jitter measuring circuit, the jitter measuring circuit comprising:
a jitter signal generating section that generates a jitter signal of which duration of at least one of High logic or Low logic changes according to a jitter in an input signal; and
an integrating section that charges and discharges a capacitor with a predetermined electric current according to the logical value of the jitter signal to integrate the jitter signal and outputs a jitter measuring signal with a level according to an amount of jitter in the input signal, and
the calibration method comprising:
making the integrating section output at least one of a predetermined charging current and a predetermined discharging current for charging and discharging the capacitor;
measuring voltage variation of the capacitor in a state where the charging current or the discharging current is output to the integrating section; and
computing gain of the integrating section based on the measured voltage variation.

8. A testing apparatus that tests a device under test, comprising:
a jitter measuring circuit comprising:
a jitter signal generating section that generates a jitter signal of which duration of at least one of High logic or Low logic changes according to a Jitter in a measured signal output from the device under test; and
an integration section that charges and discharges a capacitor with a predetermined electric current according to the logical value of the jitter signal to integrate the jitter signal and outputs a jitter measuring signal with a level according to a jitter amount of the measured signal and a delay signal obtained by delaying the measured signal by a variable delay circuit;
a deciding section that decides the good or bad of the device under test based on the jitter measuring signal; and
a calibration apparatus that previously calibrates the jitter measuring circuit, and
the calibration apparatus comprising:
a current control section that makes the integrating section output at least one of a predetermined charging current and a predetermined discharging current for charging and discharging the capacitor;
a voltage measuring section that measures voltage variation of the capacitor in a state where the charging current or the discharging current is output by the current control section; and
a gain computing section that computes gain of the integrating section based on the voltage variation measured by the voltage measuring section.

* * * * *